US012426449B2

(12) United States Patent
Tang (10) Patent No.: US 12,426,449 B2
(45) Date of Patent: Sep. 23, 2025

(54) DISPLAY PANEL AND METHOD FOR FABRICATING DISPLAY PANEL (71) Applicant: Shenzhen China Star Optoelectronics Semiconductor Display Technology Co., Ltd., Guangdong (CN)

(72) Inventor: Jia Tang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 461 days.

(21) Appl. No.: 18/088,839

(22) Filed: Dec. 27, 2022

(65) Prior Publication Data

US 2024/0188348 A1    Jun. 6, 2024

(30) Foreign Application Priority Data

Dec. 1, 2022    (CN) .......................... 202211533322.3

(51) Int. Cl.
*H10K 59/125*    (2023.01)
*H10K 59/12*    (2023.01)
*H10K 59/131*    (2023.01)
*H10K 59/80*    (2023.01)

(52) U.S. Cl.
CPC ....... *H10K 59/125* (2023.02); *H10K 59/1201* (2023.02); *H10K 59/131* (2023.02); *H10K 59/8792* (2023.02)

(58) Field of Classification Search
CPC ............. H10K 59/125; H10K 59/1201; H10K 59/131; H10K 59/8792; H10K 59/1213
See application file for complete search history.

(56) References Cited

U.S. PATENT DOCUMENTS

| 2022/0393071 | A1* | 12/2022 | Moon | H10D 86/00 |
| 2023/0027490 | A1* | 1/2023 | Kang | H01L 25/167 |
| 2023/0078185 | A1* | 3/2023 | Yoo | G06F 1/1656 |
| | | | | 156/285 |
| 2023/0155059 | A1* | 5/2023 | Lee | G02F 1/1362 |
| | | | | 257/79 |
| 2023/0170336 | A1* | 6/2023 | Jung | C09D 11/52 |
| | | | | 257/79 |
| 2023/0189564 | A1* | 6/2023 | Zhang | H10D 86/441 |
| | | | | 257/71 |
| 2023/0200139 | A1* | 6/2023 | Chei | H10K 59/122 |
| | | | | 257/40 |
| 2023/0307485 | A1* | 9/2023 | Kim | H10H 29/49 |

(Continued)

*Primary Examiner* — Mohsen Ahmadi (57) ABSTRACT

Embodiments of the present invention provide a display panel and a method for fabricating the display panel. The display panel includes an active layer, a gate, a source/drain metal layer and a first conductive layer, wherein the source/drain metal layer is stacked with the first conductive layer in the non-display area. The first conductive layer is arranged in the light-emitting area and the non-light-emitting area, and the thickness of the first conductive layer is smaller than that of the source/drain metal layer. In an embodiment of the present application, by reducing the thickness of the corresponding first conductive layer in the light-emitting area, after depositing other film layers on the thinner first conductive layer, a flat anode can be obtained, thereby enabling light-emitting film layers have the same thickness and improve the light-emitting effect of the panel.

10 Claims, 5 Drawing Sheets (56) References Cited

U.S. PATENT DOCUMENTS

| | | | |
|---|---|---|---|
| 2023/0317893 A1* | 10/2023 | Kim | H10H 20/8581 |
| | | | 257/79 |
| 2023/0325041 A1* | 10/2023 | Kim | H10K 59/40 |
| 2024/0016002 A1* | 1/2024 | Kim | H10K 59/122 |
| 2024/0063337 A1* | 2/2024 | Kim | H10H 29/142 |
| 2024/0107856 A1* | 3/2024 | Shin | H10K 59/1315 |

* cited by examiner

DISPLAY PANEL AND METHOD FOR FABRICATING DISPLAY PANEL

FIELD OF INVENTION

The invention relates to the field of display technology, and particularly to a display panel and a method for fabricating a display panel.

BACKGROUND

With the development of display technology, the technology of organic light-emitting diode (OLED) display devices is maturing day by day and has been more and more applied in various display fields.

Figure 1:
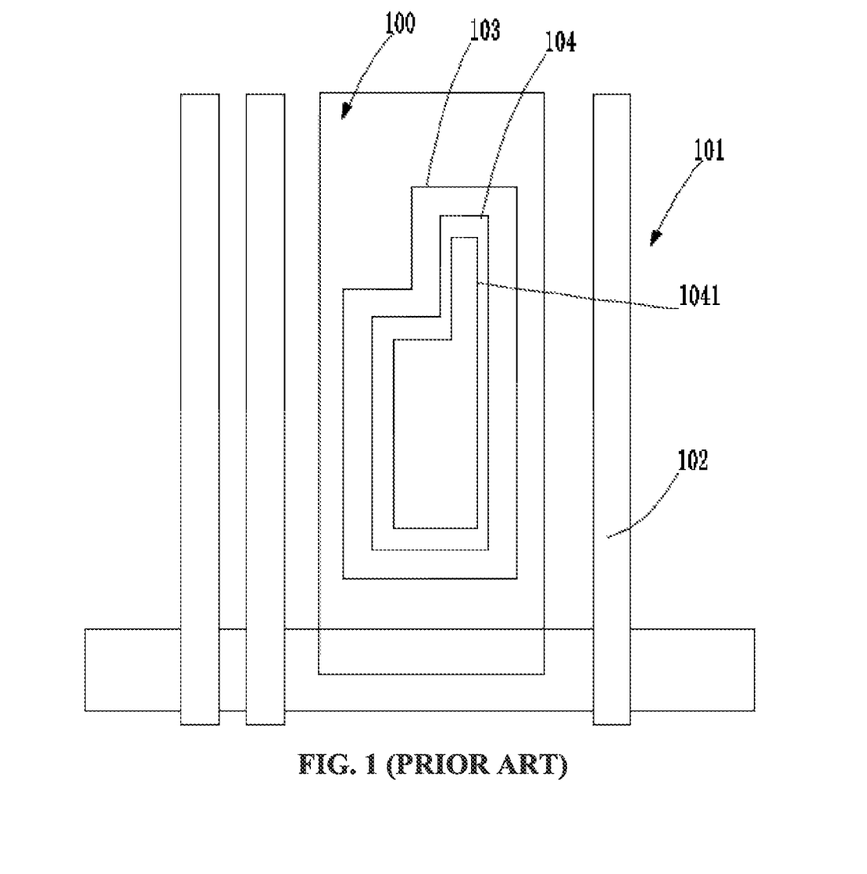
FIG. 1 is a schematic diagram of a wiring structure of an array substrate provided in the prior art.

When fabricating the above-mentioned OLED device, it needs to go through multiple processing steps, and the quality of each processing step has an important impact on the overall performance of the display panel. Usually, an array substrate needs to be fabricated first, and signal lines corresponding to a plurality of thin film transistors are arranged on the array substrate. As shown in FIG. 1, FIG. 1 is a schematic diagram of a wiring structure of an array substrate provided in the prior art. The array substrate includes a light-emitting area 100 and a non-light-emitting area 101. A plurality of signal lines 102 are disposed in the non-light-emitting area 101. At the same time, various functional layers, such as a first functional layers 103, a second functional layer 104 and planarization layers are provided at corresponding light-emitting pixel areas in the light-emitting area 100. A stacking structure will be formed between various functional film layers, and this stacking structure will cause unevenness on the surface of the film layer in the area of the light-emitting pixel, such as a phenomenon of height gap. When other film layers is continued to vapor-deposited on the film layer having the gap, such as forming a light-emitting layer by an evaporation in the light-emitting area, after the evaporation is completed, the thickness of the light-emitting layer formed in this area has the problem of inconsistency. When the display panel is emitting light, the light-emitting effect corresponding to different areas of the light-emitting layer with the uneven thickness will be different, thereby reducing the display effect of the display panel.

To sum up, in the existing display panel, when the array substrate is fabricated, there are gaps in the array substrate. When other film layers is continued to be fabricated on the array substrate with gaps, the fabricated film layers have different thicknesses in different areas, thereby reducing the display effect of the display panel.

SUMMARY

Embodiments of the present invention provide a display panel and a method for fabricating the display panel. In order to effectively improve that there are gaps on the array substrate in the light-emitting pixel area of the OLED display panel, which the gaps make the corresponding light-emitting layers in the light-emitting area have different thicknesses at different positions, leading to technical problems of unsatisfactory light-emitting effects of the display panel.

To solve the above-mentioned technical problems, the present invention provides a display panel, comprising a plurality of pixel units, wherein the pixel units comprises a light-emitting area and a non-light-emitting area arranged on at least one side of the light-emitting area, wherein the display panel comprises:
a substrate;
an active layer disposed over the substrate;
a gate disposed on the active layer;
an interlayer dielectric layer disposed on the gate;
a source/drain metal layer, wherein the source/drain metal layer is disposed on the interlayer dielectric layer and electrically connected to the active layer; and
a first conductive layer, wherein the first conductive layer is disposed on the interlayer dielectric layer;
wherein the source/drain metal layer is disposed in the non-light-emitting area, the source/drain metal layer is disposed on the first conductive layer and is electrically connected to the first conductive layer, and a thickness of the first conductive layer is smaller than a thickness of the source/drain metal layer.

According to an embodiment of the present application, the first conductive layer is disposed in the light-emitting area and the non-light-emitting area, and an orthographic projection of the source/drain metal layer on the interlayer dielectric layer is within an orthographic projection of the first conductive layer on the interlayer dielectric layer.

According to an embodiment of the present application, a thickness of the first conductive layer in the light-emitting area is smaller than a thickness of the first conductive layer in the non-light-emitting area.

According to an embodiment of the present application, a material of the first conductive layer includes any one of indium tin oxide, indium zinc oxide and indium gallium zinc oxide, and a material of the source/drain metal layer includes any one of Cu, Al, Ag and copper/molybdenum-titanium alloy.

According to an embodiment of the present application, the display panel further comprises a first via hole, and the first conductive layer is electrically connected to the active layer through the first via hole.

According to an embodiment of the present application, the display panel further comprises a light-shielding layer disposed between the substrate and the active layer.

According to an embodiment of the present application, the light-shielding layer is provided in at least two layers in the light-emitting area and the non-light-emitting area.

According to an embodiment of the present application, the display panel further comprises a second via hole, and the second via hole is arranged at the drain close to the light emitting area and the first conductive layer is electrically connected to the light-shielding layer through the second via hole.

According to an embodiment of the present application, the display panel further comprises:
a passivation layer disposed on the interlayer dielectric layer;
a planarization layer disposed on the passivation layer; and
an electrode layer disposed at least in the light emitting area, the electrode layer is disposed on the planarization layer, and the electrode layer is electrically connected to the first conductive layer through a third via hole;
wherein a thickness of the passivation layer in the light-emitting area is smaller than a thickness of the passivation layer in the non-light-emitting area, and in the light-emitting area, the upper surface of the electrode layer is a plane.

According to an embodiment of the present application, the display panel further comprises a dam, the dam is arranged in the non-light-emitting area, and the dam is arranged in the above the planarization layer.

The present application further provides a method for fabricating a display panel, comprising following steps:

providing a substrate and fabricating a thin film transistor device layer on the substrate, wherein the thin film transistor device layer includes an active layer, a gate disposed on the active layer, a gate disposed on the gate, and an interlayer dielectric layer disposed on the electrode;

etching and forming a via hole in the thin film transistor device layer, and fabricating a first conductive layer on the thin film transistor device layer, so that the first conductive layer is electrically connected to the active layer through the via hole;

fabricating a source/drain metal layer on the first conductive layer, fabricating a photoresist on the source/drain metal layer, performing a first etching on the first conductive layer and the source/drain metal layer through the photoresist to form a plurality of openings, wherein the thickness of the photoresist is different at different areas;

fabricating another photoresist on the source/drain metal layer, performing a second etching on the source/drain metal layer by using a half-mask process, and fabricating the source and drain electrodes of the thin film transistor;

fabricating a passivation layer on the source/drain metal layer and the first conductive layer, fabricating a planarization layer on the passivation layer, and etching to form a third via hole;

fabricating an electrode layer on the planarization layer, wherein the electrode layer is electrically connected to the first conductive layer through the third via hole; and inkjet-printing a light-emitting layer on the electrode layer with, and drying and curing the light-emitting layer.

The beneficial effects of the present invention at least include that embodiments of the present invention provide an array substrate, a display panel and a method for fabricating the array substrate. The array substrate includes a substrate, an active layer, a gate, a source/drain metal layer and a first conductive layer, wherein the source/drain metal layer is stacked with the first conductive layer in the non-display area. The first conductive layer is arranged in the light-emitting area and the non-light-emitting area, and the thickness of the first conductive layer is smaller than that of the source/drain metal layer. In the embodiment of the present application, by reducing the thickness of the corresponding first conductive layer in the light-emitting area, after depositing other film layers on the thinner first conductive layer, a flattened anode can be obtained, thereby ensuring The thickness of the light-emitting film layer is the same. Further, the light-emitting effect and comprehensive performance of the display panel are improved.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

The following disclosure provides different implementation modes or examples to realize different structures of the present invention in combination with the accompanying drawings in the embodiments of the present invention. To simplify the present invention, the components and arrangements of specific examples are described below. In addition, various specific process and material examples are provided herein, and those of ordinary skill in the art may recognize the application of other processes. All other embodiments obtained by those skilled in the art without creative efforts fall within the protection scope of the present invention.

In the description of the present invention, it should be understood that the terms "center", "longitudinal", "transverse", "length", "width", "thickness", "upper", "lower", "front", "Orientation indicated by rear, left, right, vertical, horizontal, top, bottom, inside, outside, clockwise, counter-clockwise, etc. The positional relationship is based on the orientation or positional relationship shown in the drawings, which is only for the convenience of describing the present invention and simplifying the description, rather than indicating or implying that the referred device or element must have a specific orientation, be constructed and operated in a specific orientation, Therefore, it should not be construed as limiting the invention. In addition, the terms "first" and "second" are used for descriptive purposes only, and cannot be interpreted as indicating or implying relative importance or implicitly specifying the quantity of indicated technical features.

The display performance of a display panel is related to many factors, such as the fabricating process of the display panel and the performance of various functional film layers inside the panel. To maintain a higher light-emitting effect, it is necessary to optimize the performance of the corresponding film layers. However, in the prior art, when fabricating the various film layers forming the display panel, such as fabricating the light-emitting layers, there will be a large gap difference in the fabrication process. This further leads to non-uniform film thicknesses of the fabricated light-emitting layer in different light-emitting areas, thereby reducing the light-emitting effect and comprehensive performance of the display panel.

Embodiments of the present application provide an array substrate and a display panel, so as to effectively improve problems such as large gaps in film layers in different areas of the display panel and inconsistent film thicknesses.

Figure 2:
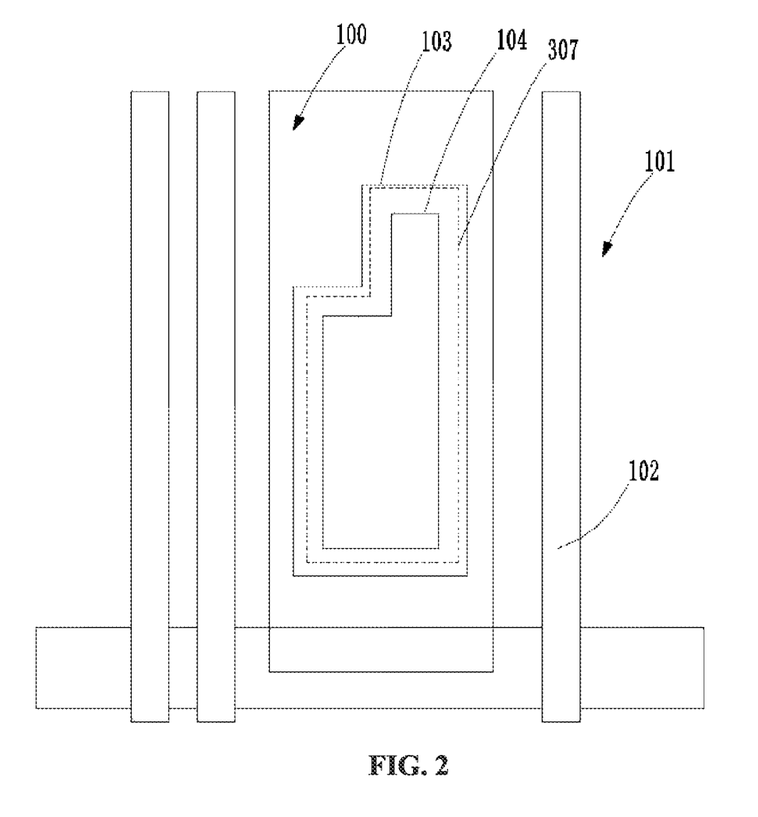
FIG. 2 is a schematic diagram of a planar wiring of an array substrate provided by an embodiment of the present application.

As shown in FIG. 2, FIG. 2 is a schematic diagram of planar wiring of a display panel provided by an embodiment of the present application. In the embodiment of the present application, the display panel includes a plurality of pixel units. Herein, the pixel unit includes a display panel including a light-emitting area 100 and a non-light-emitting area 101. Herein, the non-light-emitting area 101 can be arranged at least one side of the light-emitting area 100. In an embodiment of the present application, the array substrate includes a substrate (the film layer of the substrate are not shown in the figure), and signal lines 102 are arranged on the substrate. In the embodiment of the present application, the wiring layer corresponding to the signal line 102 may be a variety of different signal wirings, such as scanning signal lines, data signal lines, common electrode and other different signal lines.

During the fabricating process, other functional film layers, such as a first functional layer 103 and a second functional layer 104, need to be disposed in the light emitting area 100 of the array substrate. The first functional layer 103 can be a metal layer and the second functional layer 104 is a light-emitting layer. Control signals are provided to the second functional layer 104 through the first functional layer 103. The light-emitting display function of the display panel is realized through the light-emitting layer.

However, in the prior art, a base surface of the fabricated first functional layer 103 as shown in FIG. 1 is uneven. When the second functional layer 104 is continuously fabricated on the uneven base surface, a certain height difference or gap difference will appear in the second functional layer 104. Therefore, when observing the second functional layer 104 in a plan view, the height difference at different positions will correspond to a plurality of cross-section lines 1041 in the figure. However, in the embodiment of the present application, by changing the film layer structure in the display panel, such as setting a thinner first conductive layer 307 in the display panel, when continuing to deposit other films on the first conductive layer 307. Since the thickness of the first conductive layer 307 is relatively thin, the surface of the deposited first functional layer 103 can be a horizontal plane, and when the second functional layer 104 is continuously fabricated on this plane, the second functional layer 104 is also a planar structure, so as to provide the same thickness of the second functional layer 104 at different positions, effectively improve the fabricating processes of the display panel, and effectively improve the light-emitting display effect of the display panel.

Figure 3:
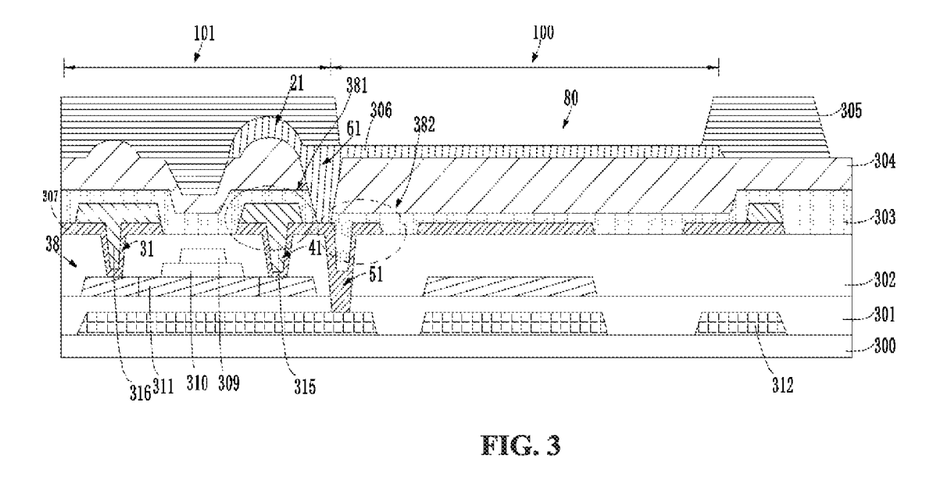
FIG. 3 is a schematic diagram of a film layer structure corresponding to an array substrate provided by the embodiment of the present application.

As shown in FIG. 3, FIG. 3 is a schematic diagram of a film layer structure corresponding to an array substrate provided in an embodiment of the present application. Herein, the array substrate includes a substrate 300 and a thin film transistor device layer. The thin film transistor device layer is arranged on the substrate 300, and thin film transistors and various dielectric layers are arranged in the thin film transistor device layer. Preferably, the substrate 300 can be a rigid layer or a flexible layer, such as a glass layer or a polyimide film layer. The substrate 300 provides effective support and cushioning effects.

Further, in the embodiment of the present application, a thin film transistor 38 is also arranged in the thin film transistor device layer. The transmission of the control signal is realized through the thin film transistor 38. Specifically, the thin film transistor device layer further includes a first buffer layer 301, a light shielding layer 312, an interlayer dielectric layer 302 and a gate insulating layer 310.

Meanwhile, the thin film transistor 38 includes an active layer 311, a gate 309, and a source/drain metal layer. Herein, in the following embodiments, the source/drain metal layer includes a source 316 and a drain 315. The source 316 and the drain 315 are electrically connected to the active layer 311 through via holes.

Specifically, the light shielding layer 312 is disposed on the substrate 300, the first buffer layer 301 is disposed on the substrate 300, and the first buffer layer 301 covers the light shielding layer 312. In the embodiment of the present application, the light-shielding layer 312 is a metallic light-shielding layer, such as aluminum and other materials.

Further, the active layer 311 is disposed on the first buffer layer 301, the gate insulating layer 310 is disposed on the active layer 311, and the gate 309 is disposed on the gate insulating layer 310. Meanwhile, the interlayer dielectric layer 302 is disposed on the gate 309 and completely covers the active layer 311, the gate insulating layer 310 and the gate 309.

In the embodiment of the present application, when the above-mentioned film layers are arranged, the source/drain metal layer is arranged in the non-light-emitting area, and the active layer 311 can be arranged on the first buffer layer 301 in a patterned manner. In the embodiment of the present application, the active layer 311 is disposed in the light-emitting area 100 and the non-light-emitting area 101. In the non-light-emitting area 101, a capacitive structure is formed between the active layer 311 and the gate 309 of the thin film transistor, and at the same time, in the light-emitting area 100, another capacitive structure is formed between the active layer 311 and other metal layers. For example, another capacitive structure can be formed between the active layer 311 and the light shielding layer 312 at the bottom, or another capacitive structure can be formed with the metal layer on it. When the device is working normally, the capacitive structure can further improve the anti-static interference ability of the device and ensure that the display panel has better working performance.

Further, the source electrode 316 is disposed on the interlayer dielectric layer 302, and the drain electrode 315 is disposed on the interlayer dielectric layer 302. Meanwhile, the source 316 is electrically connected to the active layer 311 through the first via hole 31, and the drain 315 is electrically connected to the active layer 311 through another first via hole 41, so as to realize the normal operation of the thin film transistor.

In the embodiment of the present application, when the array substrate is provided, the array substrate further includes a first conductive layer 307. Specifically, the first conductive layer 307 is disposed on the interlayer dielectric layer 302. The source/drain metal layer is disposed on the first conductive layer 307 and is electrically connected to the first conductive layer 307.

In the embodiment of the present application, the first conductive layer 307 is disposed in the light-emitting area 100 and the non-light-emitting area 101 of the display panel, and the source 316 and drain 315 are disposed in areas corresponding to the non-light-emitting area 101. In this way, the source/drain metal layer and the first conductive layer 307 form stacked structures with different thicknesses in the light-emitting area 100 and the non-light-emitting area 101.

In the embodiment of the present application, the thickness of the first conductive layer 307 may be 100 Å-1000 Å. Meanwhile, the thickness of the source/drain metal layer may be 2800 Å-8000 Å. Specifically, when setting in the embodiment of the present application, the thickness of the first conductive layer 307 is set to 200 Å, and at the same time, the thickness of the source/drain metal layer is set to 5000 Å. Therefore, while ensuring the performance of the film layer, the thinner film layer in the display panel is realized, and the performance of the display panel is improved. In the embodiment of the present application, since the thickness of the first conductive layer 307 is much smaller than the thickness of the source/drain metal layer, when other film layers are deposited on the first conductive layer 307, a relatively flat deposition surface can be obtained. If a highly flat anode with is obtained, then a light-emitting layer is deposited on the flat anode. The light-emitting layer has the same thickness at different positions, so as to ensure the light-emitting effect of the display panel.

In the embodiment of the present application, in the non-light-emitting area 101, both the source electrode 316 and the drain electrode 315 form a stacked structure with the first conductive layer 307. On the corresponding stacked structure, the width of the source electrode 316 and the drain electrode 315 may be smaller than the width of the first conductive layer 307.

Further, in the embodiment of the present application, the film thickness of the source electrode 316 and the drain electrode 315 is greater than the thickness of the first conductive layer 307, thereby reducing the impact on the source/drain metal layer during the etching process and ensuring the reliability of the device. At the same time, an orthographic projection of the source electrode 316 and the drain electrode 315 on the interlayer dielectric layer 302 is located within an orthographic projection of the first conductive layer 307 on the interlayer dielectric layer, so that the source/drain metal layer is completely disposed on the first n the conductive layer, and the contact effect between two different metal layers is ensured.

Further, at the position corresponding to the first via hole 31 and another first via hole 41, the first conductive layer 307 can fill the first via hole and be electrically connected to the active layer 311. At the same time, the source/drain metal layer is correspondingly filled in the first via hole and electrically connected with the first conductive layer.

In the embodiment of the present application, the position corresponding to the drain 315 includes an overlapping area 381 and a non-overlapping area 382. Herein, the overlapping area 381 is disposed in the non-light-emitting area 101, the non-overlapping area 382 is at least partially correspondingly disposed in the light-emitting area, and the non-overlapping area 382 is disposed on a side close to the light-emitting area 100.

In the overlapping area 381, the drain 315 is disposed on the first conductive layer 307 to form a double-layer stack. In the non-overlapping area 382, only one layer of metal is provided, such as only the first conductive layer 307 is provided.

In the embodiment of the present application, in the area corresponding to the drain 315 and the first conductive layer 307, the area where the drain 315 is in contact with the first conductive layer 307 is the overlapping area of the two. Herein, the overlapping area corresponding to the overlapping area 381 may be smaller than the area corresponding to the non-overlapping area 382. At the same time, in the non-overlapping area, a second via hole 51 is also provided, and the second via hole 51 is provided at a corresponding position on the side of the drain close to the light emitting area.

Further, in the overlapping area 381, the width of the drain 315 is smaller than the width of the first conductive layer 307 corresponding to the drain 315. In the embodiment of the present application, the drain electrode 315 is arranged on the first conductive layer, and the drain electrode 315 is arranged on one side of the first conductive layer 307, and the non-overlapping area 382 is arranged on a side close to the pixel opening 80. In this way, the problem of interference between the drain electrode 315 and the pixel opening 80 is avoided, and the pixel opening 80 of the display panel has a larger opening area.

Specifically, the first conductive layer 307 is electrically connected to the light shielding layer 312 through the second via hole 51. At the same time, one end of the first conductive layer 307 is also electrically connected to the active layer 311 of the thin film transistor through the first via hole 41. That is, in an embodiment of the present application, the drain 315 of the thin film transistor is electrically connected to the active layer 311 and the light-shielding layer 312 at the same time, thereby effectively improving the electrostatic shielding function of the array substrate.

In an embodiment of the present application, the first conductive layer 307 is correspondingly disposed in the light emitting area 100, a passivation layer 303 is disposed on the first conductive layer 307, and a planarization layer is disposed on the passivation layer 303 304. In the embodiment of the present application, since the thickness of the first conductive layer 307 is smaller than the thickness of the source/drain metal layer, when other film layers is continuously deposited on the first conductive layer 307 with a smaller thickness, a flat film layer such as a flat anode can be fabricated, and then a light-emitting layer is fabricated on the anode. The light-emitting layer has the same thickness at different positions in the light-emitting area, thereby ensuring the light emitting effect of the formed light-emitting layer.

In the embodiment of the present application, in order to ensure the contact effect between the first conductive layer 307 and the source/drain metal layer, etching can be performed at the position corresponding to the first conductive layer 307 and the via hole. After the etching is completed, the source/drain metal layer continuously goes deep into the via hole formed by the first conductive layer 307.

In an embodiment of the present application, the first conductive layer 307 and the source/drain metal layer are made of different materials. Different materials are set to meet the etching effect when different film layers are etched. Herein, the material of the first conductive layer 307 may include any one of indium tin oxide, indium zinc oxide, and indium gallium zinc oxide, and the material of the source/drain metal layer may include one of Cu, Al, Ag, and copper/molybdenum-titanium alloys. Because the materials corresponding to the two metal layers are different, the capacitance values formed between the conductive layer and other film layers in different areas are different, so that the device performance in the display panel can be effectively regulated.

Further, in the embodiment of the present application, in the light-emitting area 100, the thickness of the first conductive layer 307 can be smaller than the thickness of the corresponding first conductive layer 307 in the non-light-emitting area 101, so as to further improve the flatness of subsequent film layers. During the sequential film deposition, due to the existence of a multi-layer step structure in the non-light-emitting area, the multi-layer step structure makes the film layer in the non-light-emitting area much higher than the deposited film layer in the light-emitting area. However, in the embodiment of the present application, by controlling the thickness of the first conductive layer 307 in different areas, and the thickness of the first conductive layer 307 is relatively small, a flat surface can be obtained when depositing other film layers on the first conductive layer 307. Therefore, the film layer in the light-emitting area 100 has a flat upper surface, and ensures the planarization of the light-emitting layer that is fabricated subsequently.

In the embodiment of the present application, the display panel further includes a second passivation layer 303, a planarization layer 304 and an electrode layer 306. Specifically, the second passivation layer 303 is disposed on the thin film transistor device layer. For example, the second passivation layer 303 is disposed on the interlayer dielectric layer 302, and the second passivation layer 303 covers the second metal layer. Meanwhile, the planarization layer 304 is disposed on the interlayer dielectric layer 302, and the electrode layer 306 is disposed on the planarization layer 304.

Specifically, the electrode layer 306 is at least disposed on the film layer corresponding to the light emitting area 100. Herein, the electrode layer 306 can be an anode, and a light-emitting layer is finally formed on the anode by evaporation.

In the embodiment of the present application, the gap difference between different film layers is reduced by fabricating the second passivation layer and the planarization layer 304. Herein, the thickness of the planarization layer 304 in the light-emitting area 100 is smaller than the thickness of the planarization layer 304 in the non-light-emitting area 101.

Meanwhile, in the embodiment of the present application, in the light emitting area 100, the surface of the planarization layer 304 is a flat surface, and meanwhile, the surface of the electrode layer 306 is also a flat surface.

Preferably, the array substrate further includes a third via hole 61. The third via hole 61 is disposed in the non-light-emitting area 101, and the third via hole 61 is disposed in the non-overlapping portion 382 corresponding to the drain electrode 315. Herein, the third via hole 61 exposes the first conductive layer 307, and the electrode layer 306 is electrically connected to the first conductive layer 307 through the third via hole 61.

In the embodiment of the present application, the position where the electrode layer 306 is in contact with the first conductive layer 307 may be located between the first via hole 41 and the second via hole 51.

Further, the planarization layer 304 forms a plurality of protrusions 21 in the non-light-emitting area 101. Herein, because the source/drain in this area is a stacked structure. Therefore, the protrusion 21 may correspond to the position of the source/drain of the thin film transistor. In the embodiment of the present application, the protrusions 21 may be correspondingly disposed above the source and the drain. By providing the protrusions 21, the contact area between the protrusion 21 and the dam 305 can be increased, thereby improving the adhesiveness between the film layers and the reliability of the panel.

Further, in the embodiment of the present application, when setting the corresponding other wiring layers in the light-emitting area and the non-light-emitting area, the structure of other wiring layers can also refer to the above-mentioned first conductive layer and source/drain metal layer. For example, the metal wires such as data signal lines and power signal lines in different areas are set to a partially stacked structure according to the structure provided in the embodiment of the present application, which will not be repeated here. By changing the height of the metal wiring layer in different areas, the gap difference between the film layers is reduced, and the height of the corresponding film layer gap difference in the light emitting area is ensured to be less than or equal to 200 nm. Preferably, in the embodiment of the present application, the height of the gap difference between the corresponding film layers in the light emitting area is 200 nm.

Further, in the embodiment of the present application, the array substrate further includes a dam 305. The dam 305 is disposed in the non-light-emitting area 101, and the dam 305 makes the light-emitting area 100 form a pixel opening 80. The light-emitting layer is disposed in the pixel opening 80, so as to realize the light-emitting display of the display panel.

In the embodiment of the present application, by setting different stack structures in different areas, the gap difference between the film layer in the light-emitting area 100 and other films is reduced, the degree of planarization is improved, and a horizontal film layer is obtained. Finally, it is ensured that the light emitting layer in the light emitting area 100 has a consistent thickness at different areas. Therefore, uniform light emission of the display panel is ensured.

Further, in the embodiment of the present application, when the light-shielding layer 312 is provided, a double-layer light-shielding layer 312 can be set to further improve its electrostatic protection effect and reduce the film gap between different areas.

Further, the embodiment of the present application also provides a method for fabricating an array substrate. Specifically, the fabrication method includes the following steps:

providing a substrate and fabricating a thin film transistor device layer on the substrate, wherein the thin film transistor device layer includes an active layer, a gate disposed on the active layer, a gate disposed on the gate, and an interlayer dielectric layer disposed on the electrode;

etching and forming a via hole in the thin film transistor device layer, and fabricating a first conductive layer on the thin film transistor device layer, so that the first conductive layer is electrically connected to the active layer through the via hole;

fabricating a source/drain metal layer on the first conductive layer, fabricating a photoresist on the source/drain metal layer, performing a first etching on the first conductive layer and the source/drain metal layer through the photoresist to form a plurality of openings, wherein the thickness of the photoresist is different at different areas;

fabricating another photoresist on the source/drain metal layer, performing a second etching on the source/drain metal layer by using a half-mask process, and fabricating the source and drain electrodes of the thin film transistor;

fabricating a passivation layer on the source/drain metal layer and the first conductive layer, fabricating a planarization layer on the passivation layer, and etching to form a third via hole;

fabricating an electrode layer on the planarization layer, wherein the electrode layer is electrically connected to the first conductive layer through the third via hole; and inkjet-printing a light-emitting layer on the electrode layer with, and drying and curing the light-emitting layer.

Specifically, as shown in FIG. 4 to FIG. 7, FIG. 4 to FIG. 7 are schematic diagrams of the film layer structure corresponding to the fabricating process of the display panel provided by the embodiment of the present application.

Figure 4:
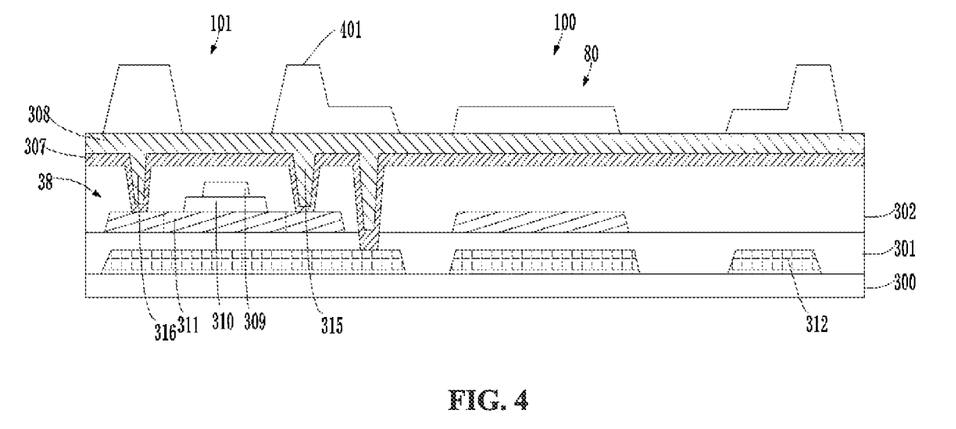
FIGS. 4, 5, 6 and 7 are schematic diagrams of film layer structures corresponding to fabrication processes of an array substrate provided in an embodiment of the present application.

In conjunction with the structure diagram of the array substrate in FIG. 3, see FIG. 4 for details. In FIG. 4, a substrate is provided first, and a thin film transistor device layer is fabricated and formed on the substrate. In the embodiment of the present application, the thin film transistor device layer can be fabricated according to the film layer structure in the prior art. For example, the active layer, the gate, and the dielectric layer between the film layers of the thin film transistor are sequentially fabricated and formed on the substrate. No more details are described here.

After the thin film transistor device layer is fabricated, the source/drain metal layer 308 and the first conductive layer 307 are disposed on the thin film transistor device layer. Herein, the source/drain metal layer 308 is disposed on the first conductive layer 307, and the first conductive layer 307 is disposed on the interlayer dielectric layer 302. Herein, the first source/drain metal layer 308 covers the light-emitting area 100 and the first conductive layer 307 in the non-light-emitting area 101.

After the fabrication is completed, a photoresist 401 is fabricated on the source/drain metal layer 308. In the embodiment of the present application, the photoresist 401 is respectively disposed in the light-emitting area 100 and the non-light-emitting area 101.

Specifically, a layer of photoresist 401 is provided at a position corresponding to the source/drain of the thin film transistor and at a position corresponding to the pixel opening 80 of the light emitting area.

Specifically, the thickness of the photoresist 401 in the light-emitting area 100 is smaller than the thickness in the non-light-emitting area 101. Meanwhile, the corresponding photoresist 401 on the drain 315 has different thicknesses. The thickness of the photoresist 401 near the non-light-emitting area is greater than that of the photoresist near the light-emitting area 100, so as to ensure that different film thicknesses can be formed by etching during etching.

Meanwhile, the thickness of the photoresist 401 in the non-light emitting area 101 is greater than the thickness of the photoresist 401 in the light emitting area 100. After the fabrication of the photoresist 401 is completed, it is subjected to etching treatment, such as light etching treatment. Meanwhile, in the embodiment of the present application, in the light emitting area 100, in the area corresponding to the photoresist 401, etching is performed by using a half-mask process.

Figure 5:
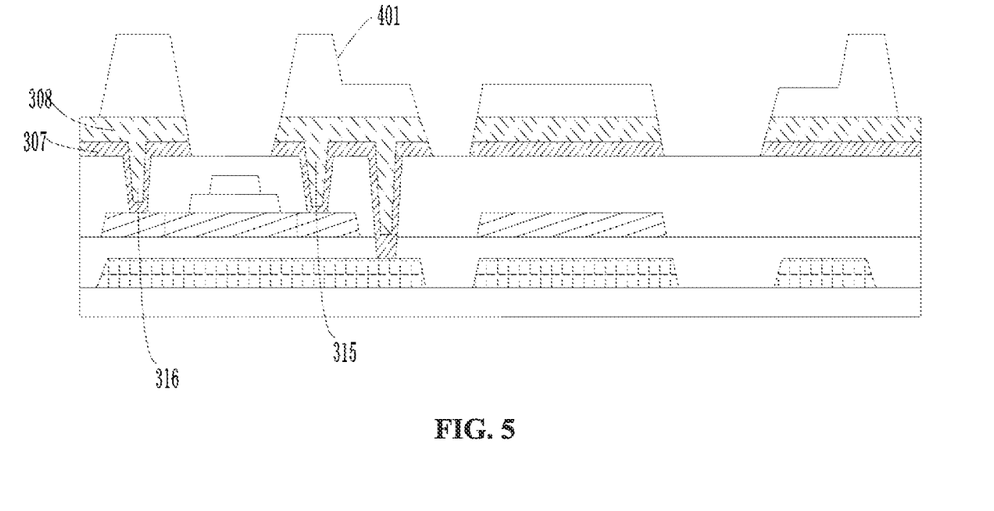

Referring to FIG. 5 in detail, after the first etching, the first conductive layer 307 and the source/drain metal layer 308 are partially etched away to form a plurality of openings.

The etching is continued. In the embodiment of the present application, since the photoresist 401 has different thicknesses at the area corresponding to the drain electrode 315, the second etching is continued.

Figure 6:
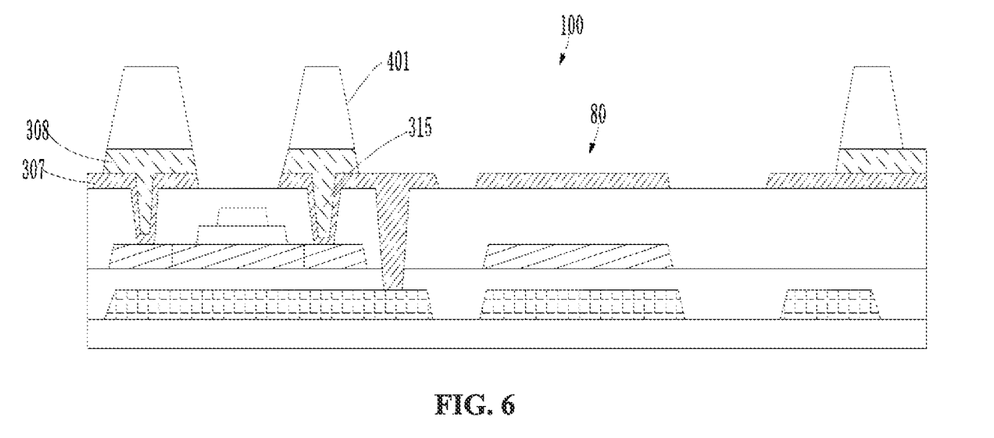

See FIG. 6 for details, the second etching is performed by a half-mask etching process. After the etching is completed, part of the film layer of the second conductive layer at the area corresponding to the drain electrode 315 is etched away. Further, a part of the first conductive layer 307 is exposed. Meanwhile, in the light emitting area 100, the source/drain metal layer 308 is completely etched. At this time, after the etching is completed, only a single layer of the first conductive layer 307 is left in the light-emitting area 100, while in the non-light-emitting area 101, the stack of the source/drain metal layer 308 and the first conductive layer is a stacked layer structure.

Specifically, in the embodiment of the present application, in the light emitting area, the thickness of the first conductive layer 307 may be 100 Å to 1000 Å. Meanwhile, the thickness of the source/drain metal layer 308 may be 2800 Å to 8000 Å.

Figure 7:
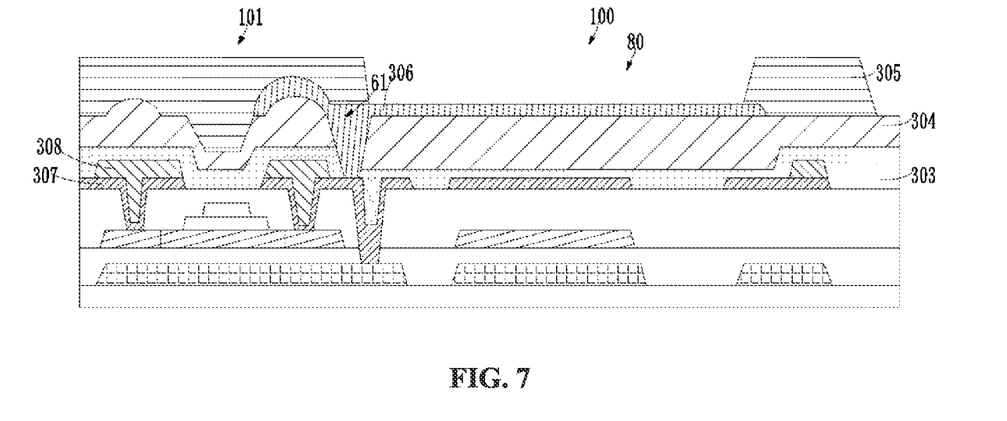

As shown in FIG. 7, for details, after the etching is completed, the source/drain metal layer 308 and the first conductive layer 307 have different stacked structures in the light-emitting area and the non-light-emitting area. The fabrication is continued, and the second passivation layer 303 is fabricated on the source/drain metal layer 308, and a planarization layer 304 is fabricated on the second passivation layer 303. At the same time, via holes are formed by etching at corresponding positions. In the embodiment of the present application, the third via hole 61 is etched and formed on the planarization layer, and an electrode layer 306 is fabricated on the planarization layer 304 corresponding to the light emitting area 100. In the embodiment of the present application, the electrode layer 306 is electrically connected to the first conductive layer through the third via hole 61.

In the embodiment of the present application, the electrode layer 306 is in the light emitting area 100, and its upper surface is a horizontal plane. At the same time, a dam 305 is set in the non-light-emitting area 101. After the dam 305 is fabricated, the dam 305 is etched in the light emitting area 100 to form a pixel opening 80.

At the same time, a light emitting layer is fabricated in the pixel opening 80. In the embodiment of the present application, the light-emitting layer can be fabricated by an evaporation process. Herein, the substrate corresponding to the light-emitting layer is the electrode layer 306, and the surface of the electrode layer 306 is a flat surface. Therefore, when the light-emitting layer and other film layers are formed by vapor deposition, the formed film layers can have the same thickness. Furthermore, the uniformity of the light-emitting performance of the display panel is effectively guaranteed, and its comprehensive performance is improved.

Further, in the embodiment of the present application, a display panel is also provided, and the above-mentioned array substrate is disposed in the display panel. Specifically, refer to the structure of the corresponding array substrate in FIG. 3 for details. In the embodiment of the present application, the array substrate includes a substrate, an active layer 311, a gate 309, an interlayer dielectric layer 302 and a source/drain metal layer 308. Herein, the active layer 311 is disposed on the substrate, the gate 309 is disposed on the active layer 311, the interlayer dielectric layer 302 is disposed on the gate 309, and the source/drain metal layer 308 is disposed on the interlayer dielectric layer 302. Further, the display panel may further include a light emitting layer disposed on the array substrate, and an encapsulation layer disposed on the light emitting layer.

In the embodiment of the present application, the array substrate further includes a first conductive layer 307, the first conductive layer 307 is disposed on the interlayer dielectric layer 302, and the source/drain metal layer 308 is disposed in the non-light-emitting area, and correspondingly disposed in the on the first conductive layer 307. In the embodiment of the present application, by setting different stacked structures in different areas, the gap difference between the film layer and other films in the light emitting area is reduced, and the planarization degree thereof is improved. Finally, it is ensured that the light-emitting layer in the light-emitting area has a consistent thickness at different areas. Thus, the display effect of the display panel is guaranteed.

Specifically, the display panel can be any product or component with a display function and a touch function, such as a mobile phone, a computer, an electronic paper, a monitor, a notebook computer, and a digital photo frame, and the specific type is not specifically limited.

To sum up, above, a display panel provided by the embodiment of the present invention and the fabrication method of the display panel are introduced in detail. In this paper, specific examples are used to illustrate the principle and implementation of the present invention. The above embodiments The description is only used to help understand the technical scheme and core idea of the present invention; although the present invention is disclosed as above with preferred embodiments, the above preferred embodiments are not intended to limit the present invention, those of ordinary skill in the art, without departing from the present invention. Various changes and modifications can be made within the spirit and scope of the present invention, so the protection scope of the present invention is based on the scope defined by the claims.

What is claimed is:

1. A display panel, comprising a plurality of pixel units, wherein the pixel units comprises a light-emitting area and a non-light-emitting area arranged on at least one side of the light-emitting area, wherein the display panel comprises:
    a substrate;
    an active layer disposed over the substrate;
    a gate disposed on the active layer;
    an interlayer dielectric layer disposed on the gate;
    a source/drain metal layer, wherein the source/drain metal layer is disposed on the interlayer dielectric layer and electrically connected to the active layer; and
    a first conductive layer, wherein the first conductive layer is disposed on the interlayer dielectric layer;
    wherein the source/drain metal layer is disposed in the non-light-emitting area, the source/drain metal layer is disposed on the first conductive layer and is electrically connected to the first conductive layer, and a thickness of the first conductive layer is smaller than a thickness of the source/drain metal layer;
    wherein the first conductive layer is disposed in the light-emitting area and the non-light-emitting area, and an orthographic projection of the source/drain metal layer on the interlayer dielectric layer is within an orthographic projection of the first conductive layer on the interlayer dielectric layer.

2. The display panel according to claim 1, wherein a thickness of the first conductive layer in the light-emitting area is smaller than a thickness of the first conductive layer in the non-light-emitting area.

3. The display panel according to claim 1, wherein a material of the first conductive layer includes any one of indium tin oxide, indium zinc oxide and indium gallium zinc oxide, and a material of the source/drain metal layer includes any one of Cu, Al, Ag and copper/molybdenum-titanium alloy.

4. The display panel according to claim 1, further comprising a first via hole, and the first conductive layer is electrically connected to the active layer through the first via hole.

5. The display panel according to claim 1, further comprising a light-shielding layer disposed between the substrate and the active layer.

6. The display panel according to claim 5, wherein the light-shielding layer is provided in at least two layers in the light-emitting area and the non-light-emitting area.

7. The display panel according to claim 6, wherein the display panel further comprises a second via hole, and the second via hole is arranged at the drain close to the light emitting area and the first conductive layer is electrically connected to the light-shielding layer through the second via hole.

8. The display panel according to claim 1, further comprising:
    a passivation layer disposed on the interlayer dielectric layer;
    a planarization layer disposed on the passivation layer; and
    an electrode layer disposed at least in the light emitting area, the electrode layer is disposed on the planarization layer, and the electrode layer is electrically connected to the first conductive layer through a third via hole;
    wherein a thickness of the passivation layer in the light-emitting area is smaller than a thickness of the passivation layer in the non-light-emitting area, and in the light-emitting area, the upper surface of the electrode layer is a plane.

9. The display panel according to claim 1, wherein the display panel further comprises a dam, the dam is arranged in the non-light-emitting area, and the dam is arranged in the above the planarization layer.

10. A method for fabricating a display panel, comprising following steps:
    providing a substrate and fabricating a thin film transistor device layer on the substrate, wherein the thin film transistor device layer includes an active layer, a gate disposed on the active layer, a gate disposed on the gate, and an interlayer dielectric layer disposed on the electrode;
    etching and forming a via hole in the thin film transistor device layer, and fabricating a first conductive layer on the thin film transistor device layer, so that the first conductive layer is electrically connected to the active layer through the via hole;
    fabricating a source/drain metal layer on the first conductive layer, fabricating a photoresist on the source/drain metal layer, performing a first etching on the first conductive layer and the source/drain metal layer through the photoresist to form a plurality of openings, wherein the thickness of the photoresist is different at different areas;
    fabricating another photoresist on the source/drain metal layer, performing a second etching on the source/drain metal layer by using a half-mask process, and fabricating the source and drain electrodes of the thin film transistor;
    fabricating a passivation layer on the source/drain metal layer and the first conductive layer, fabricating a planarization layer on the passivation layer, and etching to form a third via hole;
    fabricating an electrode layer on the planarization layer, wherein the electrode layer is electrically connected to the first conductive layer through the third via hole; and
    inkjet-printing a light-emitting layer on the electrode layer with, and drying and curing the light-emitting layer.

* * * * *